(12) United States Patent
Vivier et al.

(10) Patent No.: US 10,608,674 B2
(45) Date of Patent: Mar. 31, 2020

(54) FLEXIBLE ERROR CORRECTION

(71) Applicant: Sequand Communications S.A., Colombes (FR)

(72) Inventors: Guillaume Vivier, Colombes (FR); Imran Latif, Colombes (FR); Serdar Sezginer, Colombes (FR)

(73) Assignee: SEQUANS COMMUNICATIONS S.A., Colombes (FR)

( * ) Notice: Subject to any disclaimer, the term of this patent is extended or adjusted under 35 U.S.C. 154(b) by 0 days.

(21) Appl. No.: 15/847,468

(22) Filed: Dec. 19, 2017

(65) Prior Publication Data

US 2018/0183465 A1 Jun. 28, 2018

(30) Foreign Application Priority Data

Dec. 23, 2016 (EP) .................................... 16306814

(51) Int. Cl.
*H03M 13/00* (2006.01)
*H03M 13/35* (2006.01)
*H03M 13/39* (2006.01)
*H03M 13/29* (2006.01)
*H03M 13/37* (2006.01)
*H03M 13/25* (2006.01)

(52) U.S. Cl.
CPC ....... *H03M 13/353* (2013.01); *H03M 13/258* (2013.01); *H03M 13/2957* (2013.01); *H03M 13/3715* (2013.01); *H03M 13/3972* (2013.01); *H03M 13/6522* (2013.01); *H03M 13/6569* (2013.01)

(58) Field of Classification Search
CPC ......... H03M 13/2957; H03M 13/3715; H03M 13/3972; H03M 13/6569; H03M 13/258; H03M 13/353; H03M 13/6522; H03M 13/1111; H03M 13/6516; H03M 13/6508; H03M 13/6325; H03M 13/6527; H04L 1/0063; H04L 1/0072; H04L 25/03057; H04L 69/22; H04L 1/0057; H04L 1/005
See application file for complete search history.

(56) References Cited

U.S. PATENT DOCUMENTS

| | | | |
|---|---|---|---|
| 2014/0064413 A1 | 3/2014 | Huebner et al. | |
| 2014/0086229 A1* | 3/2014 | Yosoku | H04L 1/0063 370/338 |
| 2016/0249234 A1* | 8/2016 | Zhang | H04W 24/02 |
| 2017/0272097 A1* | 9/2017 | Weng | H03M 13/1108 |

OTHER PUBLICATIONS

Engin, "A Turbo Decoder Architecture With Scalable Parallelism," IEE Workshop on Signal Processing Systems, 298-303 (2004).
Stefano, C, et al., "Fast Simulation of Turbo Codes on GPU's," Turbo Codes and Iterative Information Processing (ISTC), 2012, IEEE, 7th International Symposium, 61-65 (2012).
European Search Report for counterpart application EP 16306814.1, dated Jun. 9, 2017.

* cited by examiner

*Primary Examiner* — Guerrier Merant
(74) *Attorney, Agent, or Firm* — Hamilton, Brook, Smith & Reynolds, P.C.

(57) ABSTRACT

A method of configuring an error correction engine, the method comprising determining the frequency of operation of the error correction engine, determining the size of the code to be error corrected, determining the time permitted in which to error correct the code, and based on the determining steps, configuring the number of active error correction processes within the error correction engine to be used to error correct the code.

15 Claims, 5 Drawing Sheets

SNR (dB)

FLEXIBLE ERROR CORRECTION

RELATED APPLICATION

This application claims priority under 35 U.S.C. § 119 or 365 to European Patent Application No. 16306814.1, filed Dec. 23, 2016. The entire teachings of the above applications are incorporated herein by reference.

TECHNICAL FIELD

This invention relates to configuration of an error correction engine. It is particularly suitable for, but by no means limited to providing a flexible turbo decoder for turbo-codes, LDPC (low-density parity check), polar or other modern forward error correction codes.

BACKGROUND

As is well known, modern forward error coding such as Turbo-codes, LDPC or Polar codes have become a ubiquitous component of modern communication systems. Traditionally Turbo-codes are better suited and used for large code block size and high data rate, the most recent low data rate versions of the LTE standard, cat-M1 and cat-NB-IoT (NB=narrowband) include Turbo-codes in their specifications. Moreover, it is foreseen that Turbo-codes, LDPC and or Polar codes will be considered in 5G, also known as New Radio in 3GPP context.

Both hardware and software implementations of Turbo decoders (TDC) employ a large amount of parallelization of the extensive internal computations to meet the throughput requirements. In the context of New Radio (NR), it is anticipated that the system will be flexible enough to accommodate a variety of services, from critical services requiring extreme low latency to best effort service, with much more relaxed time constraints. Other schemes considered include broadband mobile services as well as the possibility to serve a large number of devices. Most often, three main families of services are referred to: eMBB (enhance mobile broadband), URLLC (Ultra Reliable and Low Latency Communications) and MMTC (Massive Machine Type Communications).

With respect to resource allocation techniques, i.e. how the system maps the message to be transmitted onto available radio resources, modern wireless communications systems use a time/frequency grid. For instance, Time-Division Multiple Access (TDMA) uses the time dimension only and sequentially assigns the time resource to different users. In other words, all frequency resources are allocated to the same user at a given instant. Conversely, in classic Frequency-Division Multiplexing the resources are defined purely in the frequency domain. In most wireless systems based on OFDM (Orthogonal Frequency-Division Multiplexing), resource allocation uses both the time and frequency domains. Although the waveforms may overlap in the frequency domain, being orthogonal makes it possible to separate multiple user signals. Typically, the channel band is separated into subcarriers and a basic resource allocation structure is defined as a minimum number of subcarriers for a minimum time entity. In LTE a resource block (RB) comprises 12 subcarriers and an LTE data frame is divided into subframes which represent one Transmission Time Interval (TTI). In addition, with the use of multi-antenna, it is possible to use another dimension, the spatial dimension, on top of the time and frequency dimensions.

For recent and future wireless systems (5G, also known as New Radio in 3GPP), it is expected that any code block could be spread on the time-frequency grid in various manners, e.g. on a few frequency subcarriers but on many TTIs, or conversely on a few TTIs but on many subcarriers or any combination in between. Moreover, it is expected that the TTI or frequency grid could be of variable dimension within a single frame.

In the shorter term, one could see that cat-M (Cat-M1) and NB-IoT (NB1) are two examples of such flexible use of the time-frequency grid, in which the information bits are either spread into one TTI over 6 RBs (for cat-M1) or over 6 TTIs on 1 RB (for NB1), for example. This example simplifies the way Cat-M and NB1 are actually defined, however it does illustrate the different manner in which the time/frequency grid can be used. Moreover, in the context of low-end categories of devices (for instance trackers, sensors, smart meters some health monitoring devices etc.), the throughput requirement is no more stringent, and reduction of the number of parallel engines in the channel code decoder could be of interest. As a result, the constraints on the decoder could vary substantially from very high throughput & low latency to low throughput & high latency. From the implementation perspective, the receiver should be configured for any possible scenario.

As examples, both CAT-M and NB-IoT consider repetition in the time domain to improve the signal-to-noise ratio (SNR) and hence increase coverage. Because of the narrowband nature of NB-IoT, such repetition could be done only in the time domain. This is because before being able to decode, the receiver may have to wait and accumulate several repetitions to reach a certain SNR. Conversely, for eMBB or low latency communication, a large amount of data is send to the receiver, typically using large instantaneous bandwidth (many RBs in parallel). The receiver needs to decode the incoming data almost immediately in order to satisfy the throughput and latency requirement of the system.

These two extreme examples show the need to have a flexible receiver design that is able to accommodate a variety of possible scenarios, with the information spread over the time/frequency grid in any possible manner.

Beyond the mapping of the information into the time/frequency grid, it should be also noted that the requirement to deliver the decoded block may vary too: for critical (stringent) services (very low latency), the decoder may have to decode the code block as quickly as possible, whereas for non-critical services, the decoder may have relaxed requirements to deliver the code block.

As already mentioned, the decoders have been traditionally optimized for high throughput services, with a high amount of parallelization.

Accordingly, it is desirable to design a decoder engine for modern forward error correction codes that is flexible enough to efficiently fulfil the above large variety of use cases (over the full range of latency and throughput requirements and including power requirements of the device tasked with decoding), for which information to be decoded could be either spread in frequency and/or in time with different granularities.

SUMMARY

According to a first aspect there is provided a method as defined in claim 1 of the appended claims. Thus there is provided a method of configuring an error correction engine, the method comprising determining the frequency of operation of the error correction engine, determining the size of the code to be error corrected, determining the time permitted in which to error correct the code; and based on the determining steps, configuring the number of active error correction processes within the error correction engine to be used to error correct the code.

Optionally, the method wherein configuring step is further based on determining the number of bits of code to be error corrected that each active error correction process will deal with.

Optionally, the method wherein the code to be error corrected comprises portions of code split into processing windows.

Optionally, the method wherein the processing windows are grouped into processing groups.

Optionally, the method wherein at least one warm-up bit is added to each processing window.

Optionally, the method wherein a plurality of active error correction processes are configured to error correct in parallel.

Optionally, the method wherein the configuring step is further based on determining the number of iterations to be performed by each active error correction process.

Optionally, the method wherein the time permitted is based on a number of transmission time intervals.

Optionally, the method wherein the time permitted is based on a number of allocated resource blocks.

Optionally, the method wherein the frequency of operation of the error correction engine is derived from the clock frequency of the processor upon which the error correction engine will be executed.

Optionally, the method wherein the configuring step is further based on determining the SNR of a means by which the code to be error corrected will be provided to the error correction engine.

Optionally, the method wherein at least one further configuring step is executed based on updated determining steps.

Optionally, the method wherein the configuring step comprises obtaining parameters for configuring the error correction engine from a lookup table stored within a memory accessible to the processor upon which the error correction engine will be executed.

Optionally, the method wherein the configuring step is carried out such that at least one of bit error rate, power consumption, complexity, throughput and/or latency of the decoder is optimised.

According to a second aspect there is provided a processor as defined in claim 13. Hence there is provided a processor configured to carry out the method of the first aspect.

Optionally, the processor wherein the number of gates defining processor operation is based on the configuring step.

According to a third aspect there is provided a computer readable medium comprising computer readable instructions that when executed by a processor cause the processor to carry out the method of the first aspect.

With all the aspects, preferable and optional features are defined in the dependent claims.

Throughout this specification, code word and code block are used interchangeably.

BRIEF DESCRIPTION OF THE DRAWINGS

Embodiments will now be described, by way of example only, and with reference to the drawings in which.

In the figures, like elements are indicated by like reference numerals throughout.

Overview

A method of configuring an error correction engine is provided. As would be understood, the error correction engine may be present at a node of a network, for example a receiver of a network or wireless communications system, or other device or system where error correction of data is required. Data to be error corrected may have been transmitted over any wired or wireless network or coupling as would be understood, for example 4G, 5G, or 802.11 family. Although this disclosure primarily discusses channel coding, applicable to low layers of a communication systems, it is also applicable to any layer, whenever forward error correction is considered.

Configuration is provided dynamically by evaluating several parameters of the system being used for transmission, reception and error correction. Such parameters include the number of bits to be decoded, the speed of the processor being used to decode, the time allowed for decoding, the number of warm-up stages for the decoder, and the number of iterations to be performed. Based on the error correction requirement, any or all of these parameters may be used to determine configuration of the error correction engine. Further, the encoded message to be corrected may have been transmitted in a plurality of ways (for example being spread in time or in frequency) which may also influence configuration of the engine.

The process of turbo decoding is well known and recalled here for completeness. It comprises finding the most probable path in a treillis. For that purpose, at each state in the treillis, a metric is computed (the state metric) and the path is made based on the most probable states. The treillis could be scanned in the forward direction and/or in the backward direction, this is the well known forward-backward algorithm.

For example, the maximum block size in an LTE Category 4 UE is 6144 bits.

Considering a typical decoder frequency clock of 250 MHz, 8 iterations, 4 bits for warm-up stages and trellis termination, with a single decoding window, it can be derived that the maximum throughput of a single maximum a posteriori (MAP) decoder is: 6144/6148/8*250 MHz=31 MBit/s. However, the maximum throughput for LTE Category 4 receivers is 150 Mbit/s. Therefore, several MAP engines are used in parallel at the receiver to deal with the throughput requirement.

Further, as mentioned in the background section, Cat-M and NB-IoT are two examples of flexible use of the time-frequency grid, in which the information bits could be spread, for example, into one TTI over 6 RBs or over 6 TTIs on 1 RB.

Figure 1:
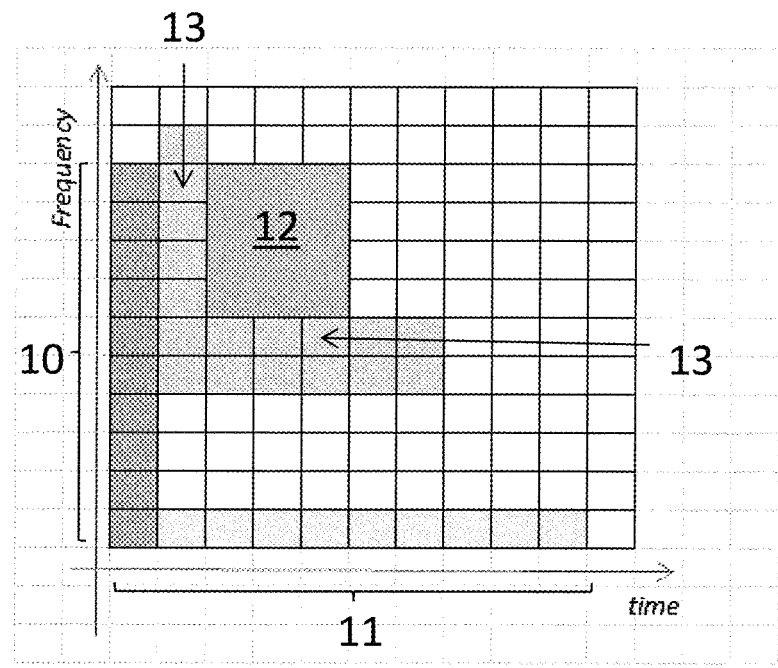
FIG. 1 illustrates a time-frequency distribution of several example code blocks.

Turning to FIG. 1 which illustrates a time-frequency distribution of several example code blocks, in a more generic 5G/New Radio context, a code block may be mapped into k frequency resources during n TTIs. Two extreme cases correspond for instance to k=1 (block is transmitted on a single subcarrier over time, see 10) or n=1 (block is transmitted on a single time interval, using a maximum number of frequency subcarriers, see 11). Further, the granularity of time/frequency may also differ from one service to another (12, 13).

As a result, an error correction decoding process can be handled in various ways from a highly parallel approach comprising many error correction processes where time to decode is important (at the cost of high processing power, and higher peak power consumption) to a slower decoding approach, requiring less parallelization, and less power.

This disclosure is described in the context of turbo decoders, but can be generalized by a person skilled in the art to any iterative decoder, applied to convolutional turbo-codes, block turbo-codes, LDPC (Low-Density Parity Check) codes, or Polar Codes, for example.

DETAILED DESCRIPTION

A turbo decoder typically uses the logarithmic Bahl-Cock-Jelinek-Raviv (Log-BCJR) algorithm which provides an implementation of a maximum a posteriori (MAP) estimation as would be understood.

To generalise, the term "MAP engine" is used herein for the processing module that computes the log likelihood ratio "LLR" (the ratio of the probability). The LLR represents the ratio of probability that a given bit be equal to 1 divided by its probability of being equal to 0.

$$\bar{b} = \ln \frac{Pr(b=1)}{Pr(b=0)}$$

Returning to FIG. 1, a receiver or other entity may need to error correct code blocks 11 and 12 at differing times.

For block 11, a number of paralleled MAP engines could be used (at the expense of additional overhead as a minimum number of operations are required per processing window as explained below). For the less demanding scenario of block 12, the processing requirement for the decoder undertaking the error correcting can be relaxed by using fewer MAP engines (less overhead as less MAP engines in parallel), ie less operations in the error correcting process.

For scenarios such as block 11, a parameter of interest is the number of bits that are fed into an individual MAP engine to calculate the LLR. Let us call this number the "window size" of a window (40 of FIG. 4). Often, it is practical to group several windows into a "window group" (41 of FIG. 4) that represents a group of windows going into a given MAP engine (see FIG. 4). So, when the decoder needs to decode a code block of a given size, the bits are split into windows and window groups, depending on the number of available active MAP engines and the size of the window. By splitting the code into windows, latency of the decoder is improved. A drawback of this is that the state metrics (either backward or forward) are unknown when the algorithm starts. To mitigate this issue, additional bits are introduced into the window to help the convergence of the MAP algorithm in each trellis. These additional bits are often referred to as "training bits" or "warm-up stages".

By way of explanation, and as is known, the complete trellis, corresponding to the complete code word can be split into several independent windows, in order to split the load of searching the path on parallel engines. The notion of trellis termination comprises adding a few bits during the encoding process to force the path to end on a given state in the trellis. As a result, the probability to end up on the right path is increased since the last states are known in advance. Similarly, the principle of a warm-up stage is to add few bits from the previous window for a given window in order to start the decoding of the given window on a stable and correct state.

The number of warm-up stages is another parameter of importance: increasing the number of warm-up stages will initially increase performance (since the more warm up stage bits added, the more likely window decoding begins on a correct state) until a ceiling is reached (because whenever convergence is reached on the path based on the warm-up bits, adding additional warm-up bits will not change the starting state of the window being decoded) but increasing the size of the individual warm-up stages will increase the latency, impact the throughput, and increase the power consumption or complexity of the decoder. So, the number of bits to add for the warm-up depends on the actual SNR, the size of the windows, the size of the code word, the required probability, the latency budget etc.

Therefore, with increased MAP engine parallelisation, more "independent" windows have to be treated, with a resultant increased overhead of warm-up stage bits to be inserted. As would be understood, limiting the number of iterations directly influences performance as well as limiting the number of warm-up stage bits. The number of iterations and warm-up stages may be changed to reach a desired performance.

Figure 2:
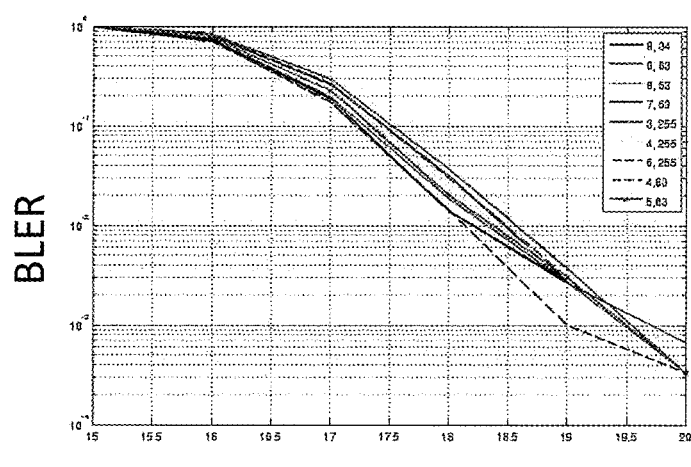
FIGS. 2 and 3 illustrate the effect of various numbers of iterations (a) and warm-up stages (b) shown as (a, b) for different transmission scenarios.
Figure 3:
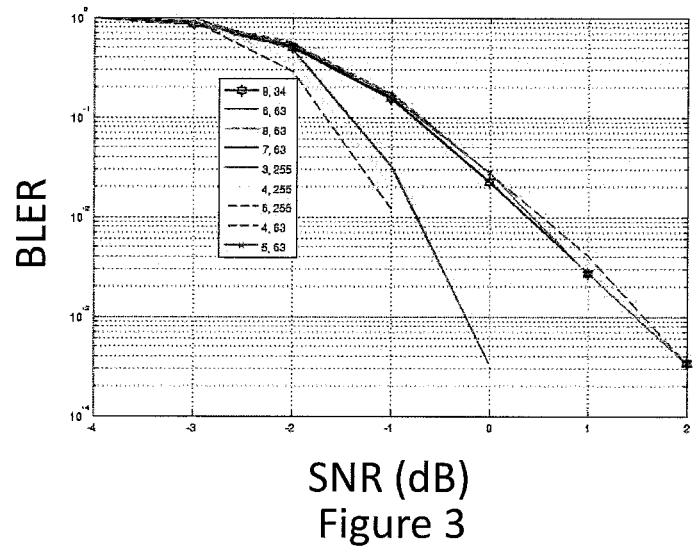

FIGS. 2 and 3 illustrate the effect of various numbers of iterations and warm-up stages for different transmission scenarios. FIG. 2 depicts typical block error rate (e.g. the probability of having an erroneous decoded message at the output of the decoder, under additive white Gaussian noise (AWGN), for the transmit mode 1 (TM1) of LTE (single transmit antenna, single receive antenna), for modulation and coding scheme 28 (MCS28), e.g. the most efficient but least robust modulation of coding scheme defined by LTE, using the 64QAM modulation and a code rate higher than 0.9). FIG. 3 depicts the same curves for a MCS 5, e.g. a more robust modulation and coding scheme using QPSK and a code rate around 0.4. On both figures as per the legend (a,b), performance is given for various iteration numbers (a) and warm-up stage sizes in bits (b).

To show the benefits of configuring a decoder (MAP engines) dynamically, a reference case of 32 MAP engines, 34 warm-up stages, 8 iterations will be considered for a 6144 bit code block size (maximum size in LTE). Complexity of decoder (MAP engines used) and time to decode will be evaluated. Complexity is defined as the number of operations using the below formula and then normalized with respect to the worst case (maximum size of the code word).

Firstly, an inflexible configuration with the above parameters is considered.

For one decoder iteration and one MAP engine, the decoding process comprises one forward calculation and then one backward calculation.

For the forward we have number of operations=F, number of operations required per bit For the backward we have number of operations=B, number of operations required per bit During the backward stage, the a posteriori probability APP is computed (not required for forward), which is why B is usually higher than F. Indeed, the APP is the actual result of the decoding stage computed after the backward operation since a decoding stage is made of a forward operation followed by a backward operation.

The CRC check and interleaving and control operations in this complexity evaluation are not taken into account since CRC calculation and other control operation are not considered by the disclosed improvements.

Let's define:

A: the code block size (at the input of the decoder)

Figure 4:
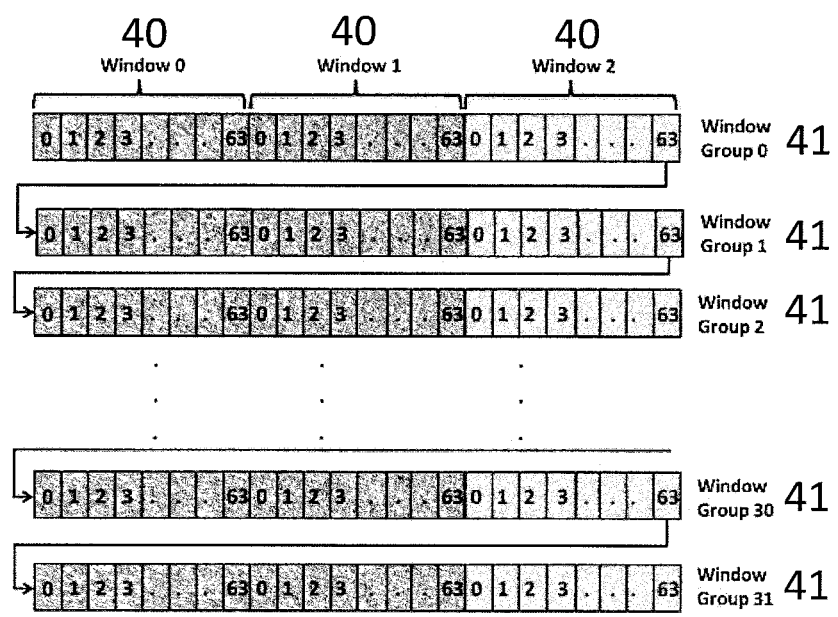
FIG. 4 illustrates a code block split into windows and window groups.

Using parallelization, it is possible to split the A bits into windows, each window being processed by a given MAP, assuming one MAP is able to process a window. In practice, it is often convenient to have two levels of split: a first split into window group and a second one in terms of window inside a window group (as depicted in FIG. 4). Hence, a MAP could e.g. handle a window group or for more flexibility every MAP could handle any window from any group.

M: the number of map engines

G: the number of window groups.

H: the number of windows per window group.

Without any loss in generality, we assume in the following that G=M (a MAP engine is dedicated to a window group).

In addition, to process one window independently to the rest of the code block, it is required to add the warm-up stage bits:

D: the number of warm-up stage bits required to add to a window before processing it Starting from the code block size A, the number of bits in a window to be processed in a window by the MAP engine is E; given by:

$$E = (A/G/H) + D$$

Therefore, for I iterations, the complexity for a given MAP engine is:

(F+B)×number of bit per window×I×number of windows per window group×number of MAP engines:

$$(F+B) \times E \times I \, H \times M$$

Figure 5:
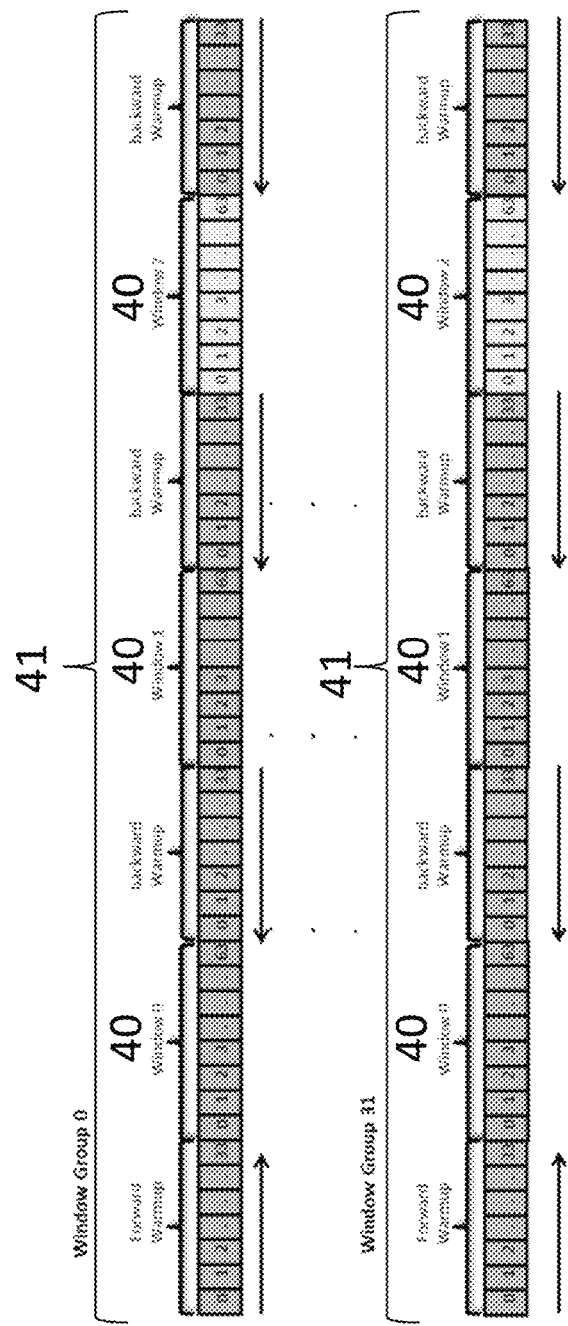
FIG. 5 illustrates warm-up stages per window in window groups.

In an implementation as shown in FIG. 5, there are 3 windows (40) per window group (41), 31 window groups, 64 bits per window and 34 bits for each warm-up stage. One window is handled by one MAP at a given time.

From this high level complexity evaluation, it can be seen that the parallelization (having higher number of MAPs) has a direct impact on complexity. Indeed, splitting the code block into smaller windows will add an overhead (the warm-up bits) that translates into additional operations to be carried out by the MAP engine.

This overhead is proportionally higher when the block size at the input of the decoder is small.

To illustrate with numbers, let's consider the following example.

code block size of 1000 bits 3 windows per window group 34 bits of warm-up stage For a 32 MAP implementation, we have a complexity in the range of ~4200×(F+B)×I. For a 4 MAP engine implementation, the complexity is about 1400×(F+B)×I.

It can be seen that from a complexity perspective, handling small size code words with fewer MAP engines provides a significant gain (3 times less operations comparing a 32 and a 4 MAP implementation), because of the impact of overhead. This gain is straightforward in the context of SW implementation.

However, when dealing with a pure hardware implementation, the complexity translates into a number of gates in a chip which are fabricated for the worst case scenario. Therefore, using less MAP engines does not always allow a chip design to be smaller.

Further, using less MAP engines may slow down the decoding process. Therefore, it could be even worse in terms of power consumption to have a smaller decoder (less MAP engines in parallel) spending more time decoding than a bigger one (more MAP engines in parallel) and able to decode very quickly in order to go to sleep much quicker.

Figure 6:
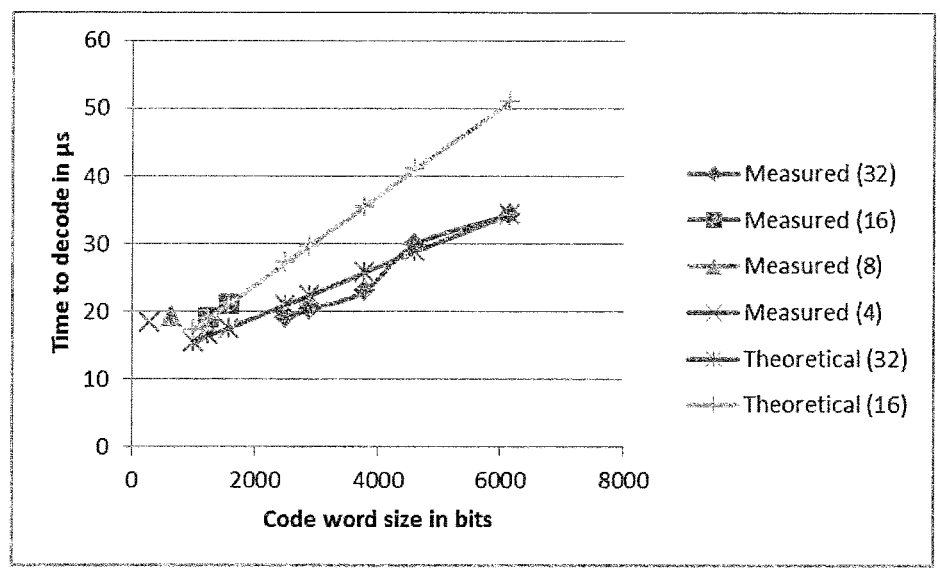
FIG. 6 illustrates measured and simulated values for differing code word sizes and numbers of MAP engines (all with 8 iterations, 34 warm-up stages.

A flexible configuration is now considered to evaluate power consumption gain in a hardware implementation by way of the time to decode for various numbers of parallel MAP engines. The time to decode is approximated as being proportional to the number of bits per window. Owing to the inherent structure of the MAP engine, it has to go through the trellis as would be understood. Various theoretical (simulated) and measured values were taken for differing code word sizes and numbers of MAP engines as shown in FIG. 6 (all with 8 iterations, 34 warm-up stages).

The following table provides simulated results:

TABLE 1 simulated results for code size v active MAP engines v processing time for 8 iterations

| CB size (byte) | Active processors | Processing time for 8 iterations |
|---|---|---|
| 35 | 4 | 18.34 us |
| 80 | 8 | 19.31 us |
| 156 | 16 | 19.00 us |
| 196 | 16 | 21.00 us |
| 312 | 32 | 19.12 us |
| 360 | 32 | 20.29 us |
| 472 | 32 | 23.00 us |
| 576 | 32 | 29.90 us |
| 768 (max) | 32 | 34.35 us |

From these figures, the following can be deduced:

Using 32 MAP engines (in parallel) instead of 16 does not divide the time to decode by a factor of 2: the impact of overhead is significant and is more important for small-size code words. Ultimately, it takes roughly the same time to decode a small packet size whatever the number of active MAP engines.

Conversely, using a small number of MAP engines in parallel for larger packet sizes increases the time to decode more and more significantly. In the case the service budget to decode the message is limited, it would be necessary to consider parallelisation.

In order to translate the time to decode and the number of active MAP engines into a relative gain in terms of power consumption, it is assumed that the power consumption is directly proportional to the number of active MAP engines (assuming that inactive MAP engines do not leak). It can be said that the overall gain is equal to the ratio of active MAP engines multiplied by the ratio of the time it takes to decode.

From FIG. 6 and table 1, the gain in terms of power consumption can be evaluated:

From 32 to 16 MAP, 1000-bit code word: 2 times less power consumption, 1.1 more time to decode.

From 32 to 16 MAP, 4600 bits: 2 times less power consumption, 1.42 more time to decode From 32 to 4 MAP, 1000 bits: 8 times less power consumption, ~1.5 more time to decode From the above analysis it can be seen that it is beneficial to adapt the MAP parameters to the input block size as well as to the service characteristics (the service characteristics being, for example, the budget allowed to decode the message e.g. for delay sensitive services (such as URLLC)) and to the hardware characteristics (the hardware characteristics being, for example, the operating frequency of the hardware or software processor, battery power level).

In order to define the set of parameters for a given service characteristics, a look-up table can be used to simplify the implementation. The lookup table is accessible by the processor that is implementing the MAP engine. Such a table (below) is tuned to a particular decoder implementation with a processor operating at a certain clock frequency. For a given frequency, x could be equal to 1, while for a lower operating frequency, x could have a higher value.

TABLE 2

Number of active MAP engines for 8 iterations and typical LTE service (need to decode within 1 subframe).

| Code Block size (in Byte) | No. of active MAP engines |
| --- | --- |
| 5-15 | x |
| 16-31 | 2*x |
| 32-63 | 4*x |
| 64-127 | 8*x |
| 128-255 | 16*x |
| 256-512 | 32*x (each processes 2 windows) |
| 513-768 | 64*x or |
|  | 32*x (each processes 3 windows) |

To generalize table 2, taking into account the time to decode budget that could change from one service to the other, constraints in terms of time to decode could be expressed as a number of TTI. Therefore, a service with the highest constraint in terms of latency is preferably decoded in a single TTI whereas a service with a more relaxed time to decode constraint could be decoded in several TTI, say t TTI, t being an integer higher than 1.

By extending the table above to take into account the t parameter to derive the number of active MAP engines, a hardware implementation can be designed with the number of active MAP engines equal to the first integer value above x.

TABLE 3

Number of active MAP engines for 8 iterations and differing time to decode constraints measured in no. of TTI, t.

| Code Block size (in Byte) | No of active MAP engines |
| --- | --- |
| 5-15 | [x/t] |
| 16-31 | [2*x/t] |
| 32-63 | [4*x/t] |
| 64-127 | [8*x/t] |
| 128-255 | [16*x/t] |
| 256-512 | [32*x/t] (each processes 2 windows) |
| 553-768 | [64*x/t] or |
|  | [32*x/t] (each processes 3 windows) |

Accordingly a method is disclosed of configuring an error correction engine by taking into account various parameters as discussed herein. The end result is a dynamically configurable error correction engine.

Figure 7:
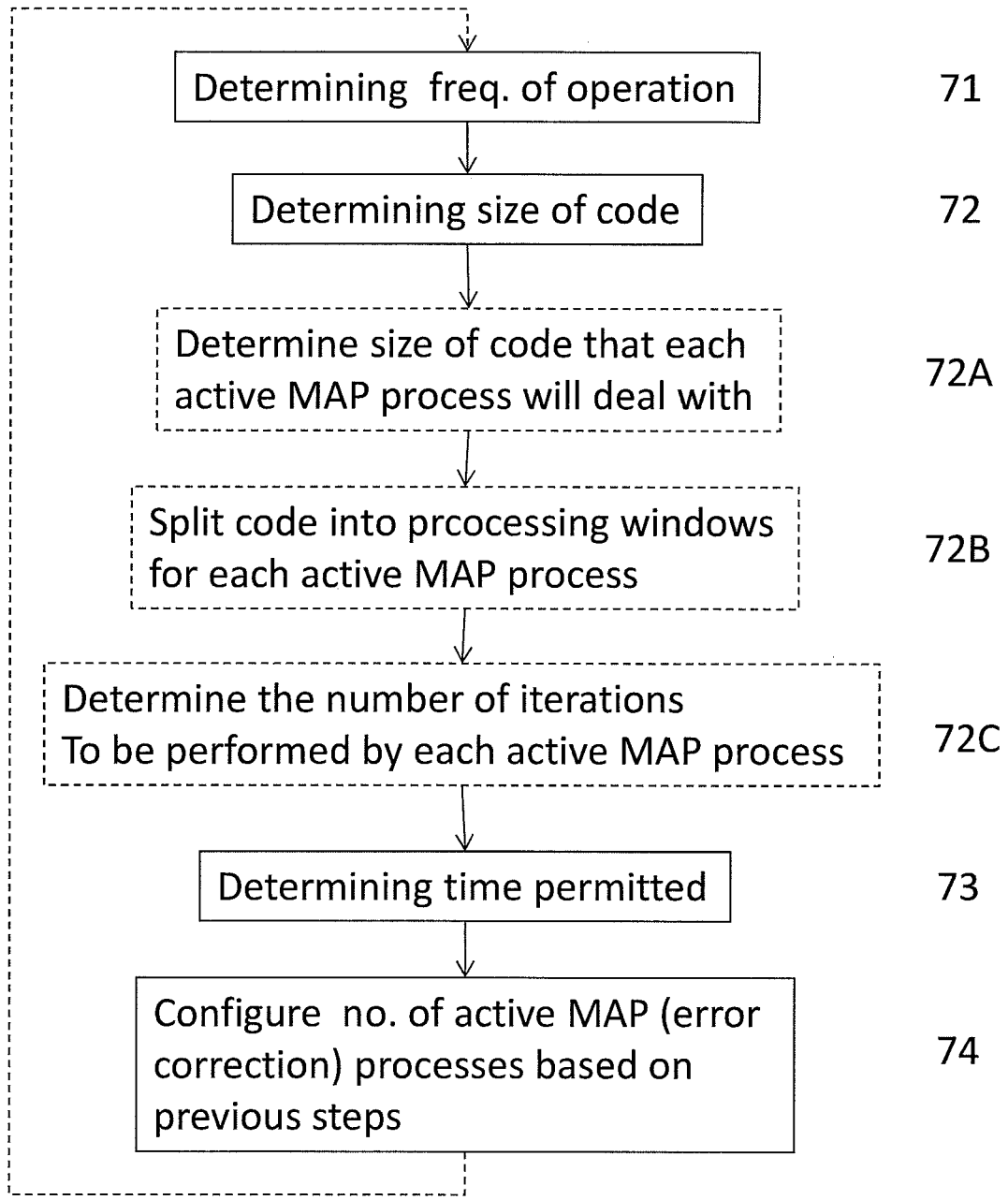
FIG. 7 illustrated a method according to embodiments.

Referring to FIG. 7, parameters of the system upon which the error correction will run are determined. Parameters determined comprise (step 71) the frequency of operation of the error correction engine which may be derived from the clock frequency of the processor upon which the error correction engine (at least one active MAP engine) will be executed, (step 72) the size of the code to be error corrected which may comprise the size of code blocks of the code, (step 73) the time permitted in which to error check code. The frequency of operation of the error correction engine may be determined based on system constraints such as the battery power level of the device; a device could operate in a power saving mode with limited maximum frequency operation dependent on the battery level present.

Step 72 may be augmented with additional determination in relation to the size of code that each active MAP process engine will deal with (step 72A). The code may be split into processing windows for each active MAP process to aid with latency of error correction (step 72B). A number of iterations to be performed by each active MAP process can also be taken into account at optional step 72C.

Step 73 may be based on a number of transmission time intervals allowed and/or a number of allocated resource blocks. Steps 71 to 73 may be carried out in any order.

At step 74, the error correction engine is configured base on the previous steps. Configuration may be achieved by way of acquiring desired parameters of the error correction engine from a look-up table available to the processor upon which the error correction engine will be executed, or passed to the processor by another associated device.

Step 74 may be augmented by considering the SNR ratio of the means by which the code to be corrected is delivered, transmitted or otherwise provided.

Additional or alternative criteria that can be considered in optional determining steps include memory size available for code window storage, type of service required (best effort, time critical, accuracy (quality) importance).

At anytime, the method can be rerun to determine a different set of parameters, or to reconfirm the previous parameters such that the error correction engine may be configured on the fly according to service requirements.

Accordingly, a MAP engine can be configured based on criteria as described herein such as:

a number of maximum parallel error correction engine (the MAP engine as above) and other hardware constraints such as frequency of operation, memory size available for the code windows) which provides the bounds of dynamic adjustability.

the type of service for which the receiver has to decode the message (is it a best effort or a time critical service) which gives the time budget for decoding as well as the quality of services required (this latter information could drive the number of iterations as well as the number of warm-up stage bits).

the incoming message (code word) characteristics (number of bits, SNR)

As would be understood, an ASIC, FPGA, PLD, microcontroller, microprocessor, processor or other programmable processing device may be used for the configurable MAP engine (device upon which the MAP engine will run), with additional parameters related to the underlying hardware at issue also taken into account in an optional step such as inherent gate design of the device, data throughput capability, processing capability, other resources also using the same processing device etc. Following the method as described herein, both software and hardware solutions can be derived. In a hardware solution, the underlying configuration of the processing device can be tailored in line with the parameters considered to optimise gate count.

The configuration of the MAP engine as described herein provides tailorable performance in terms of bit error rate at the output of the decoder, power consumption of the decoder, complexity of the decoder, throughput of the decoder and latency of the decoder (the time required to decode a code block). Any of these properties may be more important than another parameter at a particular point in time depending on the requirements of the system at issue. Accordingly, the ability to dynamically react to such requirements to configure the MAP engine on the fly is highly beneficial.

The various methods described above may be implemented by a computer program product. The computer program product may include computer code arranged to instruct a computer or processor to perform the functions of one or more of the various methods described above. The computer program and/or the code for performing such methods may be provided to an apparatus, such as a computer or a processor, on a computer readable medium or computer program product. The computer readable medium may be transitory or non-transitory. The computer readable medium could be, for example, an electronic, magnetic, optical, electromagnetic, infrared, or semiconductor system, or a propagation medium for data transmission, for example for downloading the code over the Internet. Alternatively, the computer readable medium could take the form of a physical computer readable medium such as semiconductor or solid state memory, magnetic tape, a removable computer diskette, a random access memory (RAM), a read-only memory (ROM), a rigid magnetic disc, and an optical disk, such as a CD-ROM, CD-R/W or DVD.

An apparatus such as a computer or processor may be configured in accordance with such code to perform one or more processes in accordance with the various methods discussed herein. Such an apparatus may take the form of a data processing system. Such a data processing system may be a distributed system. For example, such a data processing system may be distributed across a network.

The invention claimed is:

1. A method of configuring an error correction engine, the method comprising:
   determining the frequency of operation of the error correction engine;
   determining the size of the code to be error corrected;
   determining the time permitted in which to error correct the code, wherein the time permitted is based on a number of allocated resource blocks; and
   based on the determining steps, configuring the number of maximum a posteriori (MAP) engines within the error correction engine to be used to error correct the code.

2. The method of claim 1 wherein configuring step is further based on determining the number of bits of code to be error corrected that each MAP engine will deal with.

3. The method of claim 1 wherein the code to be error corrected comprises portions of code split into processing windows; and optionally wherein the processing windows are grouped into processing groups.

4. The method of claim 3 wherein at least one warm-up bit is added to each processing window.

5. The method of claim 2 wherein a plurality of MAP engines are configured to error correct in parallel.

6. The method of claim 1 wherein the configuring step is further based on determining the number of iterations to be performed by each MAP engine.

7. The method of claim 1 wherein the frequency of operation of the error correction engine is derived from the clock frequency of the processor upon which the error correction engine will be executed.

8. The method of claim 1 wherein the configuring step is further based on determining the SNR of a means by which the code to be error corrected will be provided to the error correction engine.

9. The method of claim 1 wherein at least one further configuring step is executed based on updated determining steps.

10. The method of claim 1 wherein the configuring step comprises obtaining parameters for configuring the error correction engine from a lookup table stored within a memory accessible to the processor upon which the error correction engine will be executed.

11. The method of claim 1 wherein the configuring step is carried out such that at least one of bit error rate, power consumption, complexity, throughput and/or latency of the decoder is optimized.

12. A processor configured to carry out the method of claim 1.

13. The processor of claim 12 wherein the number of gates defining processor operation is based on the configuring step.

14. A non-transitory computer readable medium comprising computer readable instructions that when executed by a processor cause the processor to carry out the method of claim 1.

15. The method of claim 1 wherein the frequency of operation of the error correction engine is based on one or more system constraints of a device on which the error correction engine is implemented, wherein the one or more system constraints include a battery power level of the device.

* * * * *